US010096519B2

(12) United States Patent
Shieh et al.

(10) Patent No.: US 10,096,519 B2
(45) Date of Patent: *Oct. 9, 2018

(54) METHOD OF MAKING A FINFET DEVICE

(71) Applicant: Taiwan Semiconductor Manufacturing Company, Ltd., Hsin-Chu (TW)

(72) Inventors: Ming-Feng Shieh, Yongkang (TW); Wen-Hung Tseng, Yilan County (TW); Tzung-Hua Lin, Taipe (TW); Hung-Chang Hsieh, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/257,469

(22) Filed: Sep. 6, 2016

(65) Prior Publication Data

US 2016/0379889 A1 Dec. 29, 2016

Related U.S. Application Data

(63) Continuation of application No. 14/057,789, filed on Oct. 18, 2013, now Pat. No. 9,437,497.

(51) Int. Cl.
*H01L 21/76* (2006.01)
*H01L 27/088* (2006.01)
(Continued)

(52) U.S. Cl.
CPC .. *H01L 21/823431* (2013.01); *H01L 21/3081* (2013.01); *H01L 21/31111* (2013.01);
(Continued)

(58) Field of Classification Search
None
See application file for complete search history.

(56) References Cited

U.S. PATENT DOCUMENTS 8,557,675 B2 10/2013 LiCausi
9,437,497 B2 * 9/2016 Shieh .............. H01L 21/823431
(Continued)

FOREIGN PATENT DOCUMENTS

CN 103187261 7/2013
KR 20050027781 A 3/2005
(Continued)

OTHER PUBLICATIONS

Korean Intellectual Property Office, Notice of Allowance, Application No. 10-2014-0140519, dated May 11, 2016 , 3 pages—with English Translation and Summary.

*Primary Examiner* — Charles Garber
*Assistant Examiner* — Xiaoming Liu
(74) *Attorney, Agent, or Firm* — Haynes and Boone, LLP

(57) ABSTRACT

A method of fabricating a fin-like field-effect transistor device is disclosed. The method includes forming mandrel features over a substrate and performing a first cut to remove mandrel features to form a first space. The method also includes performing a second cut to remove a portion of mandrel features to form a line-end and an end-to-end space. After the first and the second cuts, the substrate is etched using the mandrel features, with the first space and the end-to-end space as an etch mask, to form fins. Depositing a space layer to fully fill in a space between adjacent fins and cover sidewalls of the fins adjacent to the first space and the end-to-end space. The spacer layer is etched to form sidewall spacers on the fins adjacent to the first space and the end-to-end space and an isolation trench is formed in the first space and the end-to-end space.

20 Claims, 10 Drawing Sheets

(51) Int. Cl.
*H01L 21/02* (2006.01)
*H01L 21/8234* (2006.01)
*H01L 21/308* (2006.01)
*H01L 21/311* (2006.01)
*H01L 21/762* (2006.01)

(52) U.S. Cl.
CPC .............. *H01L 21/76224* (2013.01); *H01L 21/823468* (2013.01); *H01L 21/823481* (2013.01); *H01L 27/0886* (2013.01)

(56) References Cited

U.S. PATENT DOCUMENTS

| | | |
|---|---|---|
| 2005/0056888 A1* | 3/2005 | Youn ............... H01L 21/823437 257/331 |
| 2008/0121970 A1 | 5/2008 | Aritome |
| 2010/0243602 A1 | 9/2010 | Chen et al. |
| 2010/0267172 A1 | 10/2010 | Xiao et al. |
| 2011/0037128 A1* | 2/2011 | Chakravarti ...... H01L 21/82345 257/379 |
| 2012/0091511 A1* | 4/2012 | Chen .................. H01L 21/3086 257/213 |
| 2012/0108027 A1 | 5/2012 | Xiong et al. |
| 2012/0235247 A1 | 9/2012 | Cai et al. |
| 2012/0244711 A1 | 9/2012 | Yin et al. |
| 2015/0111362 A1 | 4/2015 | Shieh et al. |

FOREIGN PATENT DOCUMENTS

| | | |
|---|---|---|
| KR | 2006070727 A | 6/2006 |
| KR | 20130059275 A | 6/2013 |
| KR | 20130081627 A | 7/2013 |

* cited by examiner

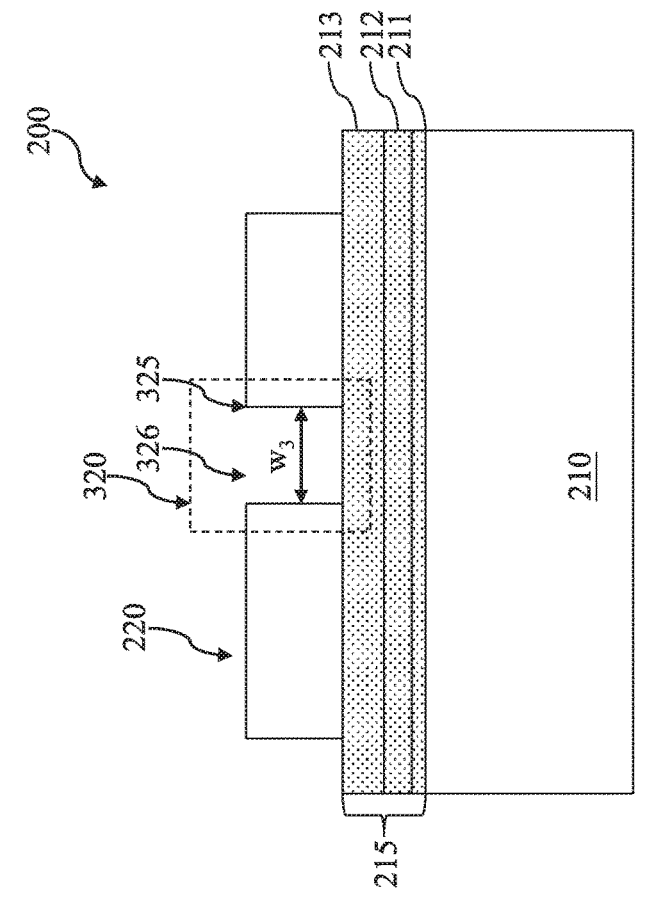
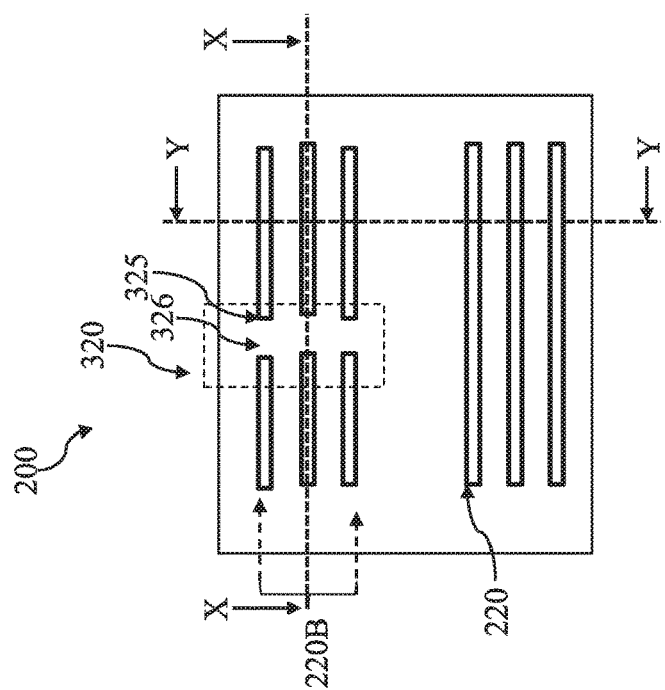
FIG. 4B
FIG. 4A

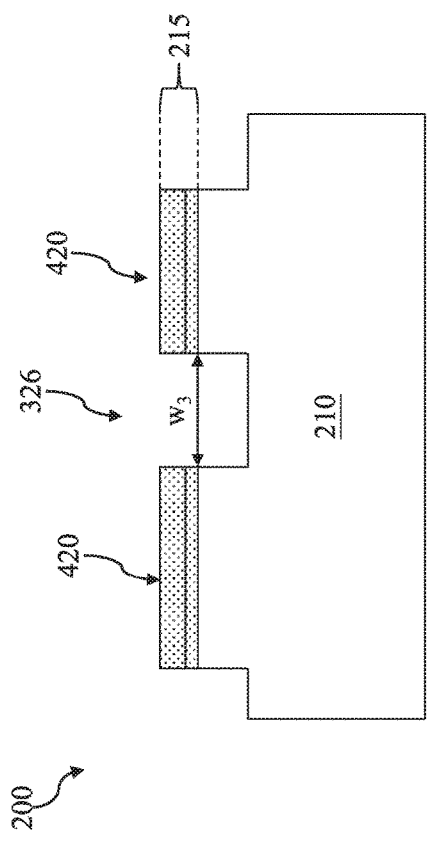
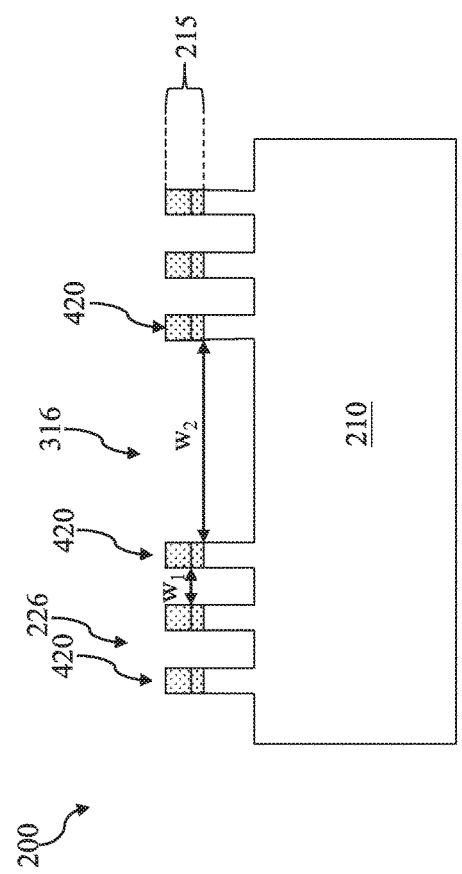

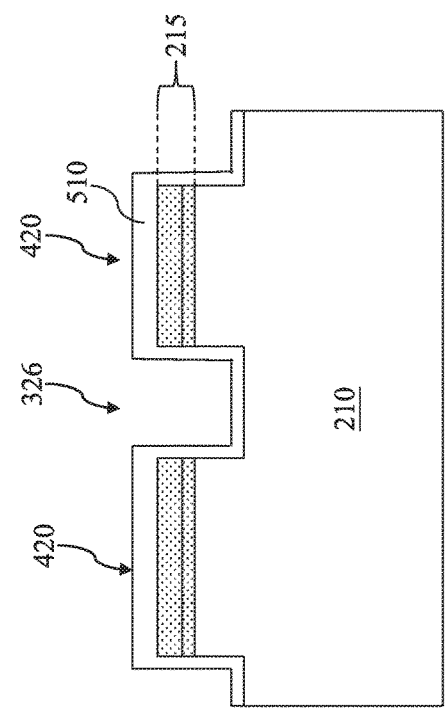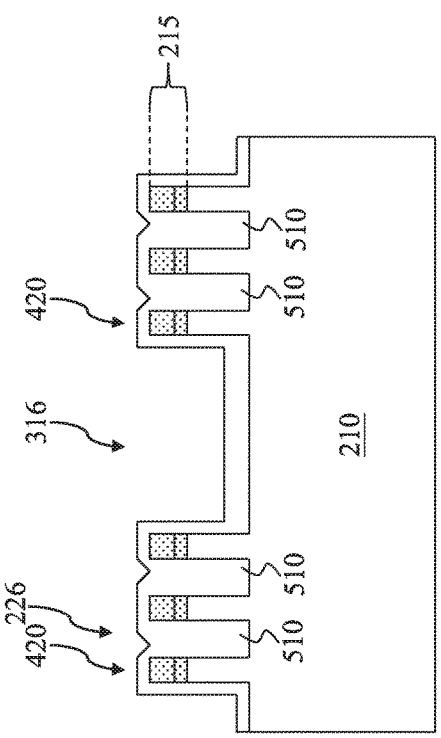

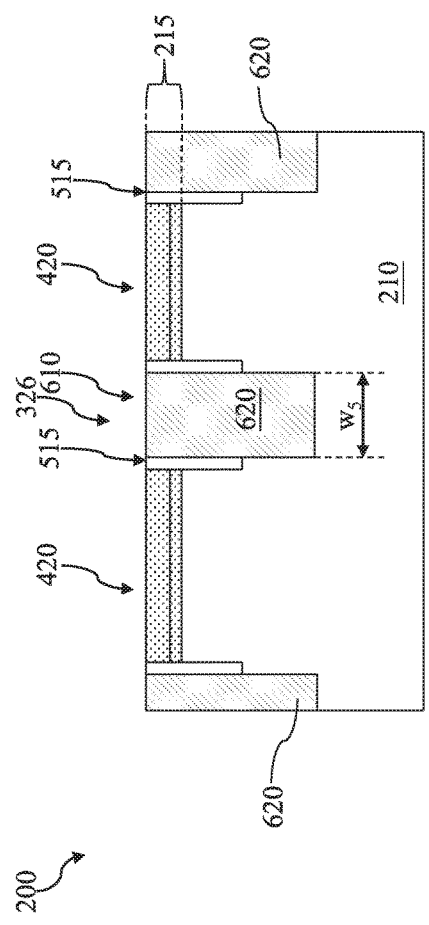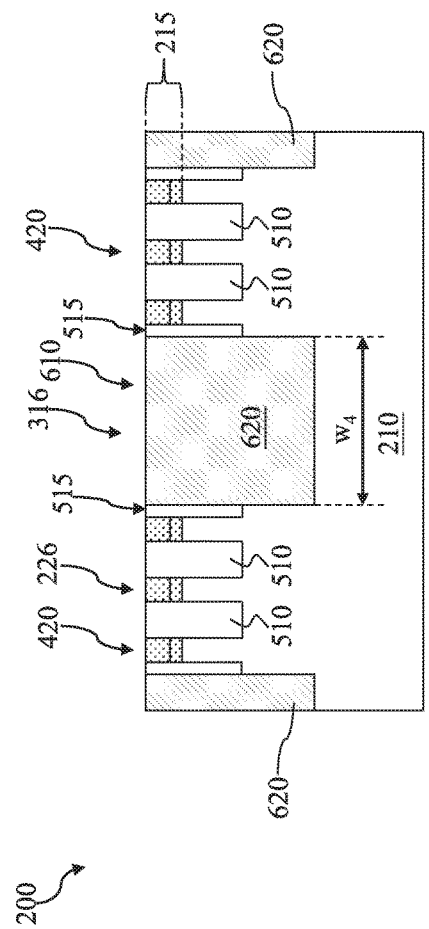
FIG. 9A
FIG. 9B

METHOD OF MAKING A FINFET DEVICE

PRIORITY DATA

The present application is a continuation application of U.S. application Ser. No. 14/057,789, filed Oct. 18, 2013, which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a more flexible integration for forming fin and isolation structures is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4A is a diagrammatic top view of a FinFET device at fabrication stages constructed according to the method of FIG. 1

FIG. 4B is a cross-sectional view of an example FinFET device along line Y-Y in FIG. 4A at fabrication stages constructed according to the method of FIG. 1.

FIGS. 5A, 6A, 7A, 8A, 9A and 10A are cross-sectional views of an example FinFET device along line X-X in FIG. 4A at fabrication stages constructed according to the method of FIG. 1.

FIGS. 5B, 6B, 7B, 8B, 9B and 10B are cross-sectional views of an example FinFET device along line Y-Y in FIG. 4A at fabrication stages constructed according to the method of FIG. 1

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1:
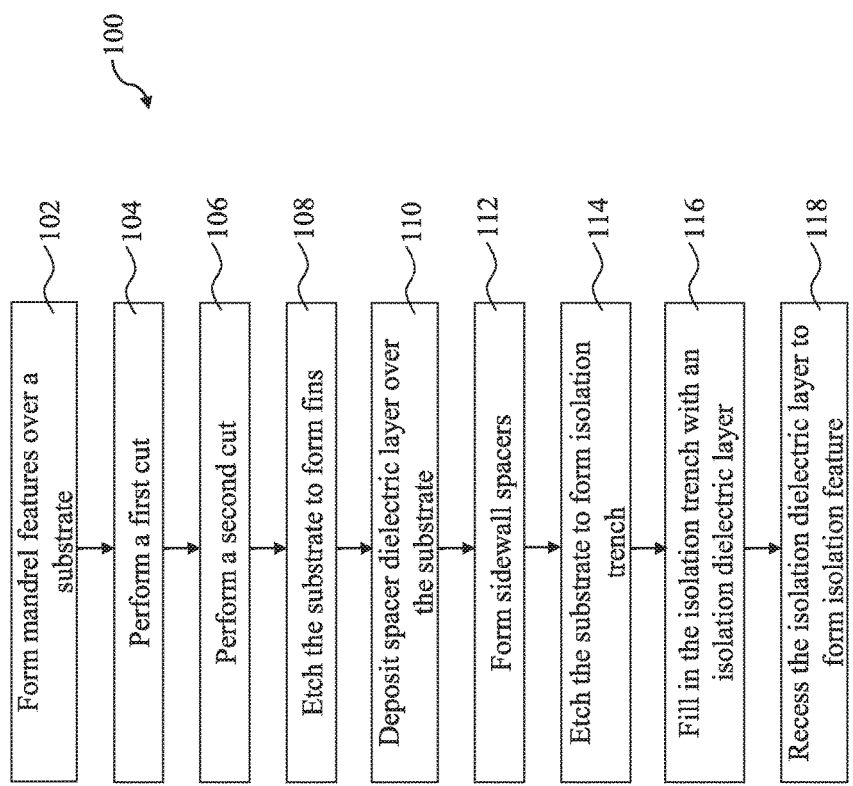
FIG. 1 is a flow chart of an example method for fabricating a semiconductor device according to various aspects of the present disclosure.

FIG. 1 is a flowchart of a method 100 for fabricating a FinFET device according to aspects of the present disclosure. It is understood that additional steps can be provided before, during, and after the method, and some of the steps described can be replaced or eliminated for other embodiments of the method. The method 100 is discussed in detail below, with reference to a FinFET device 200 shown in FIGS. 2A to 10B for the sake of example. The present disclosure repeats reference numerals and/or letters in the various embodiments. This repetition is for the purpose of simplicity and clarity and does not in itself dictate a relationship between the various embodiments and/or configurations discussed.

Figures 2A, 2B:
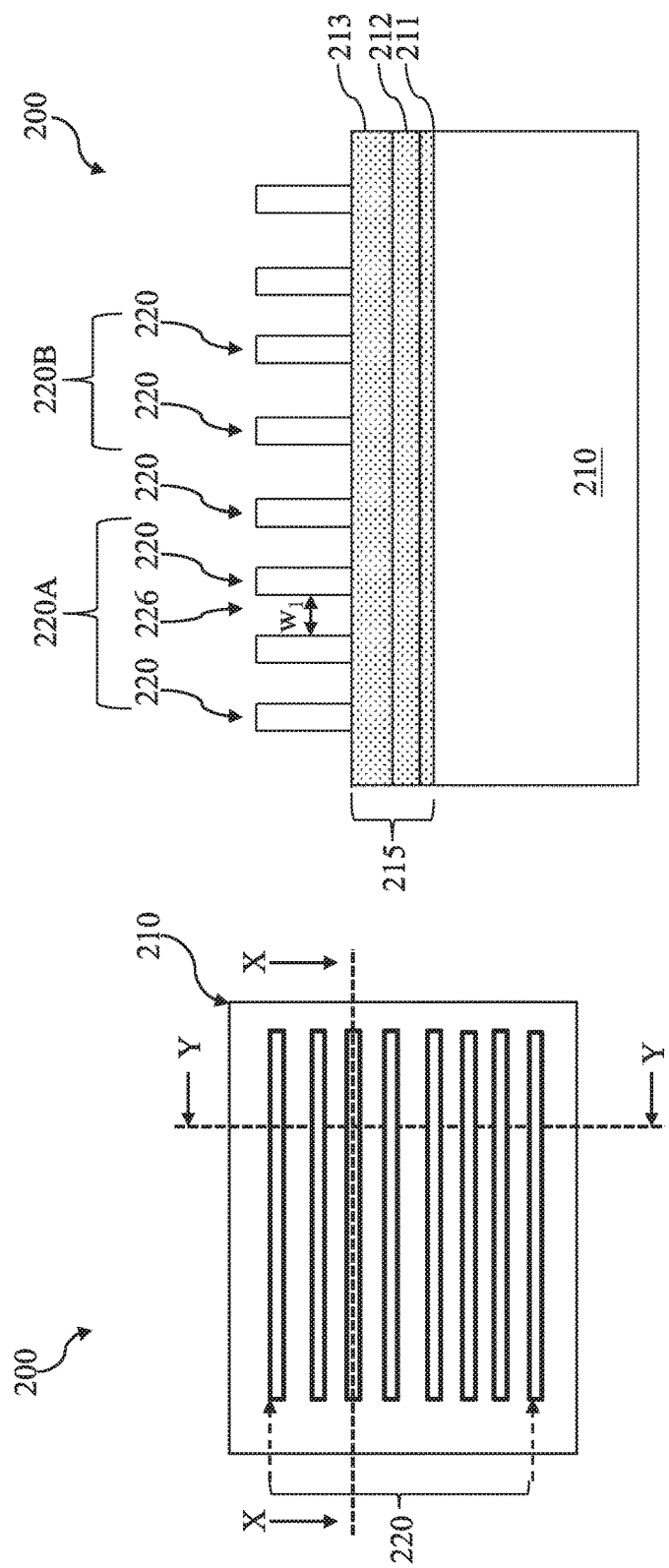
FIG. 2A is a diagrammatic top view of a FinFET device at fabrication stages constructed according to the method of FIG. 1
FIG. 2B is a cross-sectional view of an example FinFET device along line Y-Y in FIG. 2A at fabrication stages constructed according to the method of FIG. 1.

Referring to FIGS. 1 and 2A-2B, the method 100 begins at step 102 by forming a plurality of mandrel features 220 on a substrate 210. Although the mandrel features 220 are illustrated as rectangular-shaped lines, such is not required for some embodiments. Each mandrel feature 220 is a dummy feature and will be removed at a later fabrication stage.

The substrate 210 includes a semiconductor substrate, such as a silicon wafer. Alternatively, the substrate 210 includes germanium, silicon germanium or other proper semiconductor materials. In one embodiment, the substrate 210 includes an epitaxy (or epi) semiconductor layer. In another embodiment, the substrate 210 includes a buried dielectric material layer for isolation formed by a proper technology, such as a technology referred to as separation by implanted oxygen (SIMOX). In some embodiments, substrate 210 may be a semiconductor on insulator, such as silicon on insulator (SOI).

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

In one embodiment, prior to forming the mandrel features 220, a hard mask 215 is formed over the substrate 210 to provide protection to a fin structure in subsequent processes. The hard mask 215 may include multiple layers to gain process flexibility. In the present example, the hard mask 215 includes a first oxide layer 211 deposited over the substrate 210, a silicon nitride layer 212 deposited over the first oxide layer 211 and a second silicon oxide layer 213 deposited over the silicon nitride layer 212. One or more of the layers 211, 212 and 213 may be formed by various methods, including thermal oxidation, a chemical vapor deposition (CVD) process, plasma enhanced CVD (PECVD), atomic layer deposition (ALD), and/or other methods known in the art.

The mandrel features 220 are then formed over the hard mask 215. In one embodiment, the mandrel features 220 are formed by depositing a mandrel material layer, such as a dielectric material (silicon oxide, silicon nitride for examples); forming a patterned photo resist layer over the mandrel material layer; and etching the mandrel material layer using the patterned resist layer as an etch mask, thereby forming the mandrel features 220. In another embodiment, the mandrel features 220 are resist patterns. In one embodiment, a first space 226 between adjacent mandrel features 220 is a first width $w_1$.

Figure 3B:
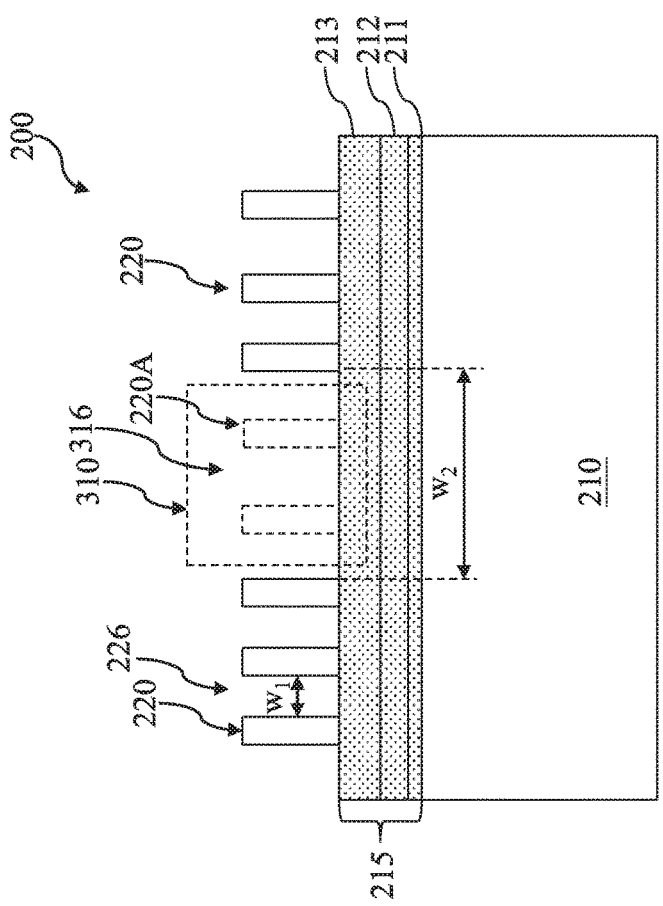
FIG. 3B is a cross-sectional view of an example FinFET device along line X-X in FIG. 3A at fabrication stages constructed according to the method of FIG. 1.
Figure 3A:
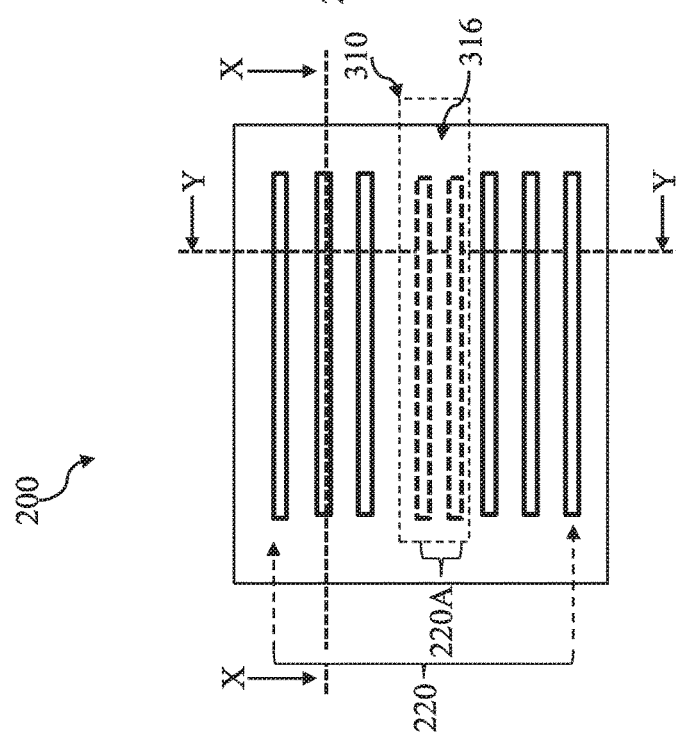
FIG. 3A is a diagrammatic top view of a FinFET device at fabrication stages constructed according to the method of FIG. 1

Referring to FIGS. 1 and 3A-3B, the method 100 proceeds to step 104 by performing a first cut in a first region 310 along X-X direction to remove a subset of the mandrel features 220, such as the group 220A, to form a second space 316 having a second width $w_2$. In some cases, the first cut is referred to as an X-cut. In one embodiment, the first cut is formed by forming a first cut pattern having first openings such that a subset of the mandrel features 220, labeling with 220A is uncovered. Then the first cut pattern is used as an etch mask during a subsequent etch process to remove the mandrel features 220A.

Referring to FIGS. 1 and 4A-4B, the method 100 proceeds to step 106 by removing a portion of each mandrel feature of a group 220B in a second region 320, referred to as a second cut, to form a line-end 325 and an end-to-end space 326. In some cases, the second cut is referred to as a Y-cut. In the present embodiment, the line-end 325 aligns in a second direction Y-Y perpendicular to a first direction X-X. The end-to-end space 326 has a third width $w_3$ which is substantially larger than the first width $w_1$. In one embodiment, the second cut is performed by forming a second cut pattern having a second opening in the second region 320 such that the portion of each the mandrel feature of the group 220B within the second openings is uncovered. Then the second cut pattern is used as an etch mask during a subsequent etch process to remove the portion of each mandrel feature of the group 220B in the second openings. The etch process may be implemented by any suitable techniques, such as a wet etch, a dry etch, or a combination thereof. By using the cut technique, the line-end 325 may be formed with a substantially vertical profile and it may reduce issues of line-end shortening and corner rounding dramatically.

Referring to FIGS. 1 and 5A-5B, the method 100 proceeds to step 108 by recessing the substrate 210 to form a plurality of fins 420 by using the mandrel features 220 as an etch mask. The fins 420 carry the first space 226, the end-to-end space 326 and the first spaces 316. In one embodiment, the substrate 210 is etched by a selective etch. The etch process selectively removes the substrate 210, as well as the hard mask 215, but substantially does not etch the mandrel features 220. The etch process may include a dry etching, a wet etching, and/or a combination thereof. A wet etching process can use solutions such as tetramethylammonium hydroxide (TMAH), a HF/HNO3/CH3COOH solution, $NH_4OH$, KOH (potassium hydroxide), HF (hydrofluoric acid), or other suitable solution. A dry etching process can include a plasma etching process that uses a chlorine-based chemistry. Other dry etchant gasses include $CF_4$, $NF_3$, $SF_6$, and He. Dry etching may include transformer coupled plasma (TCP) etch, electron cyclotron resonance (ECR) etch and reactive ion etch (RIE).

In the present embodiment, the fins 420 are formed to carry the first space 226 (having the first width $w_1$), the second space 316 (having the second width $w_2$), the end-to-end space 326 (having the third width $w_3$) and have the hard mask 215 as its top layer.

Thereafter, the mandrel features 220 are removed by a suitable process. In one example where the mandrel features 220 are resist patterns, they are removed by wet stripping or plasma ashing. In another example, the mandrel features 220 are made by a dielectric material and it may be removed by a wet etching process to selectively remove the mandrel material. In one embodiment, one or more layers of the hard mask 215, such as the second oxide layer 213, is removed also.

Referring to FIGS. 1 and 6A-6B, the method 100 proceeds to step 110 by depositing a spacer layer 510 over the substrate 210. In present embodiment the spacer layer 510 is configured such that it fully fills in the first space 226, covers sidewalls in the second space 316 and the end-to-end space 326 and partially fills in the second space 316 and the end-to-end space 326. The spacer layer 510 includes silicon oxide, silicon nitride, silicon oxynitride, or other suitable materials, or combinations thereof. The spacer layer 510 may be deposited by CVD, ALD, or any other suitable techniques.

Figure 7A:
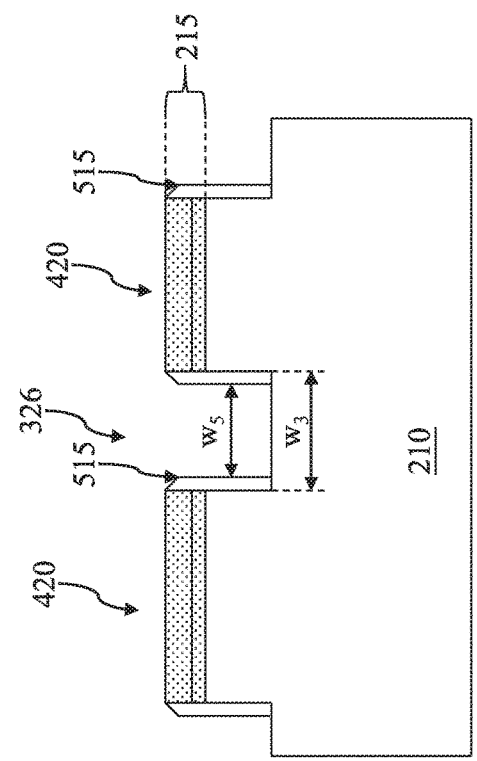
Figure 7B:
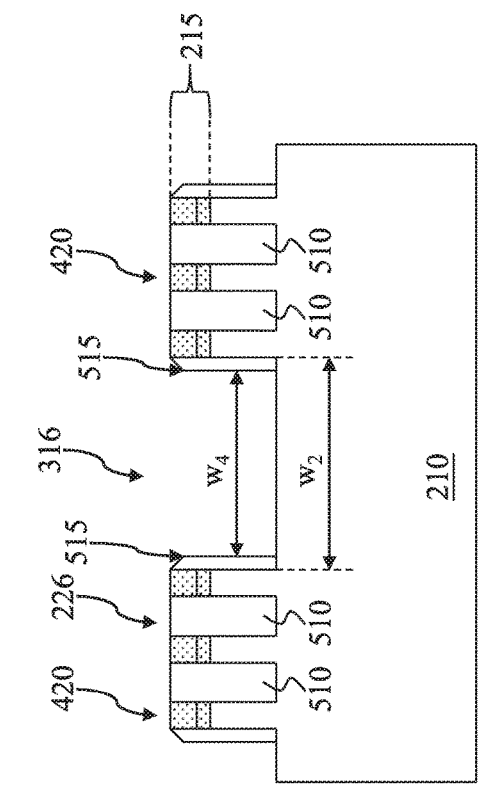

Referring to FIGS. 1 and 7A-7B, the method 100 proceeds to step 112 by etching the spacer layer 510 to form spacers 515 on sidewalls of fins 420 in the second space 316 and the end-to-end space 326. In the present embodiment, the spacer etch process is controlled such that it removes the spacer layer 510 on the hard mask 215 in the fins 420; removes the spacer layer 510 at the bottom of the second space 316 and the end-to-end space 326 to expose the substrate 210, and remains in the first space 226 be filled with the spacer layer 510. The etch process may include any suitable processes, such as an anisotropic plasma etch. With the spacer 515, the second width $w_2$ of the second space 316 and the third width $w_3$ of the end-to-end space 326 become smaller, referred to as a forth width $w_4$ and a fifth width $w_5$ respectively.

Figure 8A:
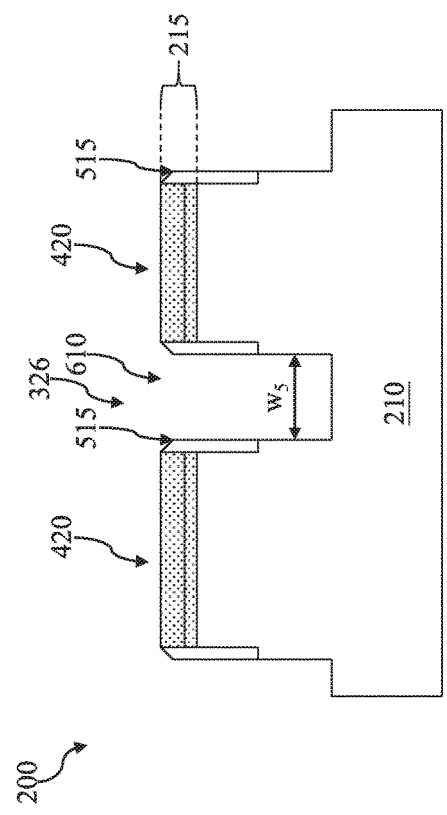
Figure 8B:
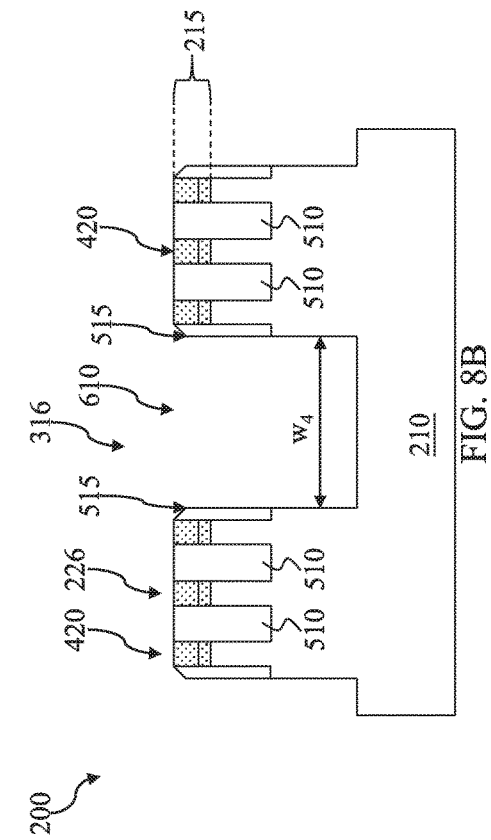

Referring to FIGS. 1 and 8A-8B, the method 100 proceeds to step 114 by performing a trench etch to etch the exposed portion of the substrate 210 in the second space 316 and the end-to-end space 326 to form isolation trenches 610. The etch process may include a selective wet etch or a selective dry etch. A wet etching solution includes a tetramethylammonium hydroxide (TMAH), a $HF/HNO_3/CH_3COOH$ solution, or other suitable solution. Dry etching processes include a biased plasma etching process that uses a chlorine-based chemistry. Other dry etchant gasses include $CF_4$, $NF_3$, $SF_6$, and He. The etch process may include multiple etch steps to optimize the etch effect.

Protected by a combination of the hard mask 215, the spacer layer 510 filled in the first space 226 and the spacer 515, the fins 420 remain intact during the trench etch. It may not only minimize the trench etch impacts on uniformity of sizes of the fin 420 and the first space 226, especially for those close to the second space 316 and the end-to-end space 326, but also relaxes constrains of the trench etch process. The trench etch may align with the spacer 515, thus the isolation trench 610 may be formed with self-alignment nature, which can benefit etch process window improvement. The isolation trench 610 is formed with a same width as the fourth width $w_4$ and the fifth width $w_5$ in the second space 316 and in the end-to-end space 326, respectively.

Referring to FIGS. 1 and 9A-9B, the method 100 proceeds to step 116 by filling in the isolation trench 610 with an isolation dielectric layer 620. The isolation dielectric layer 620 includes silicon oxide, silicon nitride, silicon oxynitride, or other suitable materials, or combinations thereof. In some examples, the isolation dielectric layer 610 has a multi-layer structure. The isolation dielectric layer 620 may be deposited by CVD, ALD, or any other suitable techniques. A chemical mechanical polishing (CMP) process may be performed subsequently to remove excess isolation dielectric layer 620 to expose the hard mask 215 in the fins 420 and also provide a substantially planar surface.

Figure 10A:
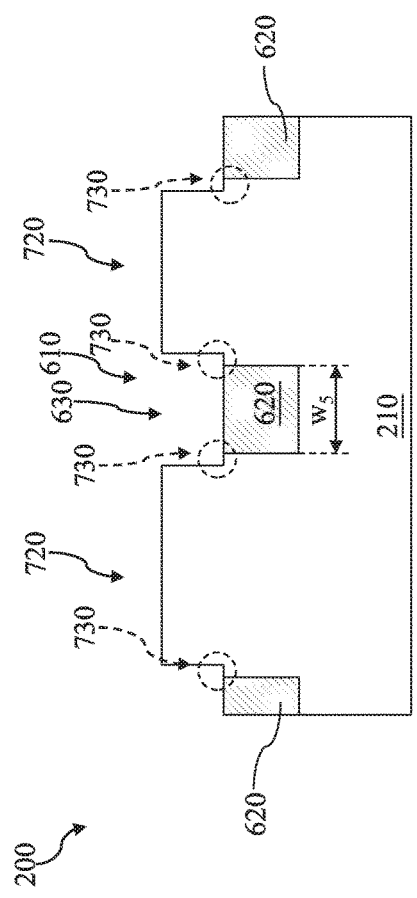
Figure 10B:
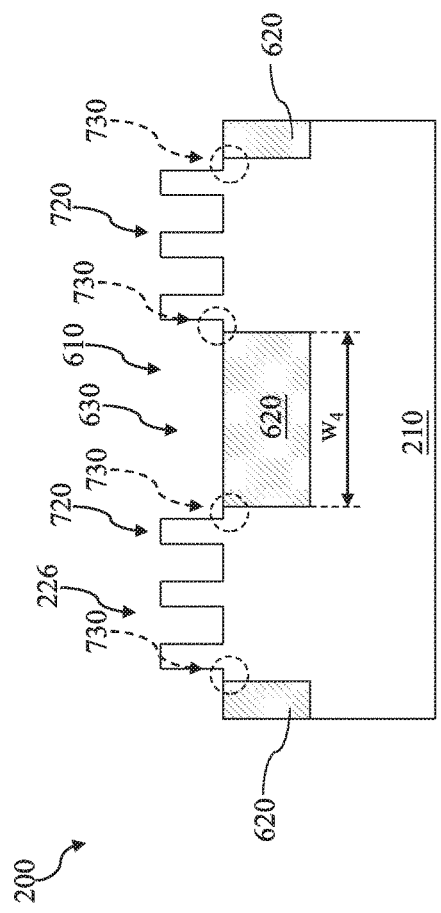

Referring to FIGS. 1 and 10A-10B, the method 100 proceeds to step 118 by removing the hard mask 215 and the spacer layer 510 in the first space 226 to reveal the fins, now labeled with the reference number 720, and recessing the isolation dielectric layer 620 to form an isolation feature 630 in the isolation trench 610. The isolation feature 630 provides electrical isolation between active regions. The etch processes includes a selective wet etch or a selective dry etch, or a combination thereof. In one embodiment, the t hard mask 215 and the spacer layer 510 is removed and then the isolation dielectric layer 620 is recessed. In another embodiment, the t hard mask 215, the spacer layer 510 and the isolation dielectric layer 620 are etched same time. After the spacers 515 are removed, a shoulder-shape structure 730 is left in the substrate 210 at feet of some of the fins 720, which have the spacers 515 previously. Each of the shoulder-shape structure 730 has a substantial same width.

Additional steps can be provided before, during, and after the method 100, and some of the steps described can be replaced or eliminated for other embodiments of the method.

The FinFET device 200 undergoes further CMOS or MOS technology processing to form various features and regions. The FinFET device 200 may include a high-k (HK)/metal gate (MG) over the substrate 210, including wrapping over a portion of the fins 720 in a gate region, where the fins 720 may serve as gate channel region. In a gate first process scheme, the HK/MG is all or part of a functional gate. Conversely, in a gate last process scheme, a dummy gate is formed first and is replaced later by the HK/MG after high thermal temperature processes are performed, such as thermal processes during sources/drains formation.

The FinFET device 200 may also include an interlayer dielectric (ILD) layer formed between the HK/MG over the substrate 210. The ILD layer includes silicon oxide, oxynitride or other suitable materials. The ILD layer includes a single layer or multiple layers.

The FinFET device 200 may also include a source/drain feature in a source/drain regions in the substrate 210, including in another portion of the fins 720. As an example, a portion of the fins 720 in the source/drain regions is recessed first. Then, a semiconductor material epitaxially grows in the recessed portion of the fins 720 to form the source/drain feature. The semiconductor material includes Ge, Si, GaAs, AlGaAs, SiGe, GaAsP, or other suitable material.

The FinFET device 200 may also includes various contacts/vias/lines and multilayers interconnect features (e.g., metal layers and interlayer dielectrics) over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a method for fabricating a FinFET device. The method employs a scheme of forming fin first, with a X-cut and Y-cut, and isolation trench last. The method employs protecting the fin during the formation of the isolation trench. The method provides an isolation trench formation with a self-alignment nature and reduced width. The method demonstrates improvements of process window and uniformity of size of the fin and a space between fins.

The present disclosure provides many different embodiments of fabricating a FinFET device that provide one or more improvements over existing approaches. In one embodiment, a method for fabricating a FinFET device receiving a substrate, forming a mandrel features over the substrate. The method also includes performing a first cut to remove one or more mandrel features to form a first space, performing a second cut to remove a portion of one or more mandrel features to form an end-to-end space. The method also includes after the first and the second cuts, etching the substrate by using the mandrel features, with the first space and the end-to-end space, as an etch mask to form fins. The method also includes depositing a spacer layer to fully fill in a space between adjacent fins and cover sidewalls of the fins adjacent to the first space and the end-to-end space. The method also includes etching the spacer layer to form sidewall spacers on the fins adjacent to the first space and the end-to-end space and forming an isolation trench in the first space and the end-to-end space with the sidewall spacers covering the fins and the spacer layer filling in the space between the adjacent fins.

In another embodiment, a method for fabricating a FinFET device includes receiving a substrate having a hard mask, forming a plurality of mandrel features over the hard mask, removing one or more mandrel features to form a first space, removing a middle portion of at least one mandrel features to form an end-to-end space. The method also includes using the first space and the end-to-end space as an etch mask for etching the hard mask and substrate using the mandrel features to form fins. The method also includes, after etching, removing the mandrel features. The method also includes depositing a spacer layer over the substrate, including fully filling in a space between two adjacent fins, covering sidewalls of the fins in the first space and the end-to-end space, and partially filling in the first space and the end-to-end space. The method also includes performing a spacer etch to form sidewall spacers on the fin in the first space and the end-to-end space and to remove the spacer layer at bottoms of the first space and the end-to-end space to expose the substrate. The method also includes etching the exposed substrate to form an isolation trench, filling in the isolation trench with an isolation dielectric layer. The method also includes recessing the isolation dielectric layer to form an isolation feature in the isolation trench and removing the spacer layer between the adjacent fins.

In yet another embodiment, a method for fabricating a FinFET device includes providing a substrate, forming a plurality of fins over the substrate; forming a first space and an end-to-end space among the fins, depositing a spacer layer to fill in a space between adjacent fins and cover sidewalls of the fins in the first space and the end-to-end space, forming sidewall spacers on the fins in the first space and the end-to-end space, forming an isolation trench in the first space and the end-to-end space, wherein fins are protected by the spacer layer and the spacer and forming an isolation feature in the isolation trench by depositing an isolation dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   removing a portion of a semiconductor substrate to form a first fin and a second fin, wherein a trench extends between the first and second fins into the semiconductor substrate;
   forming a spacer layer over the first and second fins and within the trench;
   etching the spacer layer to form a sidewall spacer on the first fin and to expose another portion of the semiconductor substrate, wherein the spacer layer remains within the trench after etching the spacer layer to form the sidewall spacer on the first fin;
   forming an isolation trench in the semiconductor substrate adjacent the first fin, wherein the spacer layer remains within the trench while forming the isolation trench in the semiconductor substrate adjacent the first fin;
   depositing a dielectric in the isolation trench to form an isolation feature;
   removing the spacer layer from the trench to expose the first and second fins; and
   recessing the dielectric of the isolation feature such that a top surface of the isolation feature is substantially coplanar with and contacts a horizontal surface of the semiconductor substrate that extends between the isolation feature and the first fin.

2. The method of claim 1, wherein depositing the dielectric to form the isolation feature in the isolation trench includes depositing the dielectric in the isolation trench prior to removing the spacer layer from the trench to expose the first and second fins.

3. The method of claim 1, wherein forming the spacer layer over the first and second fins and within the trench includes forming the spacer layer within the trench such that the spacer layer completely fills the trench.

4. The method of claim 1, further comprising forming a hard mask layer over the semiconductor substrate, and
   wherein removing the portion of the semiconductor substrate to form the first fin and the second fin further includes removing a portion of the hard mask layer.

5. The method of claim 4, wherein removing the spacer layer from the trench to expose the first and second fins further includes removing another portion of the hard mask layer.

6. The method of claim 1, further comprising removing the sidewall spacer on the first fin after forming the isolation feature in the isolation trench.

7. The method of claim 1, wherein the removing of the spacer layer from the trench to expose the first and second fins and the recessing of the dielectric of the isolation feature are performed concurrently.

8. A method comprising:
   forming a hard mask layer over a semiconductor substrate;
   removing a portion of the hard mask layer and a portion of the semiconductor substrate to form a first fin and a second fin, wherein a first trench extends between the first and second fins;
   forming a first dielectric layer over the first and second fins and within the first trench;
   removing a portion of the first dielectric layer to form a sidewall spacer on the first fin and to expose another portion of the semiconductor substrate, wherein the first dielectric layer remains within the first trench after removing the portion of the first dielectric layer to form the sidewall spacer on the first fin;
   removing the another portion of the semiconductor substrate adjacent the first fin to form a second trench, wherein the first dielectric layer remains within the first trench while forming the second trench in the semiconductor substrate adjacent the first fin;
   forming a second dielectric layer in the second trench;
   recessing the second dielectric layer to be substantially coplanar with a surface of the semiconductor substrate extending between the second dielectric layer and the first fin; and
   removing the first dielectric layer from the first trench to expose the first and second fins.

9. The method of claim 8, wherein the removing the first dielectric layer from the first trench to expose the first and second fins occurs after removing the another portion of the semiconductor substrate adjacent the first fin to form the second trench.

10. The method of claim 8, removing another portion of the hard mask layer to expose the first and second fins.

11. The method of claim 8, wherein forming the second dielectric layer in the second trench includes forming the second dielectric layer directly on the sidewall spacer.

12. The method of claim 11, further comprising removing the sidewall spacer from the second trench.

13. The method of claim 8, wherein forming the hard mask layer over the semiconductor substrate includes:
   forming a first oxide layer over the semiconductor substrate;
   forming a nitride layer over the first oxide layer; and
   forming a second oxide layer over the nitride layer.

14. The method of claim 8, wherein forming the first dielectric layer over the first and second fins and within the first trench includes completely filling the first trench with the first dielectric layer.

15. The method of claim 12, wherein the recessing of the second dielectric layer and the removing of the sidewall spacer from the second trench are performed concurrently.

16. A method comprising:
   removing a portion of a semiconductor substrate to form a first fin, a second fin, and a third fin, wherein a first trench having a first width extends from the first fin to the second fin and a second trench having a second width extends from the second fin the third fin, the second width being different than the first width;

forming a first dielectric layer in the first trench and the second trench;

removing a portion of the first dielectric layer from the second trench to form a sidewall spacer on the second fin and expose another portion of the semiconductor substrate, wherein the first dielectric layer remains within the first trench after removing the portion of the first dielectric layer from the second trench to form the sidewall spacer on the second fin;

removing the another portion of the semiconductor substrate from the second trench to extend the second trench further into the semiconductor substrate, wherein the first dielectric layer remains within the first trench while removing the another portion of the semiconductor substrate;

forming a second dielectric layer within the extended second trench;

recessing the second dielectric layer to form a shallow trench isolation structure such that a top surface of the shallow trench isolation structure is substantially coplanar with a surface of the semiconductor substrate extending between the second fin and the shallow trench isolation structure; and removing the first dielectric layer from the first trench.

17. The method of claim 16, wherein the first and second fins are exposed within the first trench after removing the first dielectric layer from the first trench.

18. The method of claim 16, further comprising forming a high-k dielectric layer and a metal gate electrode layer over the first and second fins.

19. The method of claim 16, further comprising removing the sidewall spacer on the second fin after removing the another portion of the semiconductor substrate from the second trench to extend the second trench further into the semiconductor substrate.

20. The method of claim 16, wherein the recessing of the second dielectric layer to form the shallow trench isolation structure and the removing the first dielectric layer from the first trench are performed concurrently.

* * * * *